(12) United States Patent
Guo et al.

(10) Patent No.: US 12,658,897 B2
(45) Date of Patent: Jun. 16, 2026

(54) APPARATUS AND METHOD FOR GENERATING CIRCUIT CLOCK SIGNAL

(71) Applicants: Beijing Youzhuju Network Technology Co., Ltd., Beijing (CN); Lemon Inc., Grand Cayman (KY)

(72) Inventors: Junyan Guo, Beijing (CN); Mingming Zhang, Beijing (CN); An Zhao, Beijing (CN); Junmou Zhang, Los Angeles, CA (US); Chuang Zhang, Los Angeles, CA (US); Shan Lu, Los Angeles, CA (US); Jian Wang, Beijing (CN)

(73) Assignees: Beijing Youzhuju Network Technology Co., Ltd., Beijing (CN); Lemon Inc., Grand Cayman (KY)

( * ) Notice: Subject to any disclaimer, the term of this patent is extended or adjusted under 35 U.S.C. 154(b) by 0 days.

(21) Appl. No.: 18/597,096

(22) Filed: Mar. 6, 2024

(65) Prior Publication Data

US 2024/0305284 A1 Sep. 12, 2024

(30) Foreign Application Priority Data

Mar. 6, 2023 (CN) ........................ 202310204895.X

(51) Int. Cl.
*H03K 5/08* (2006.01)
*H03K 5/133* (2014.01)
*H03K 5/15* (2006.01)

(52) U.S. Cl.
CPC ............ *H03K 5/084* (2013.01); *H03K 5/133* (2013.01); *H03K 5/15033* (2013.01)

(58) Field of Classification Search
CPC ..... H03K 5/084; H03K 5/133; H03K 5/15033
See application file for complete search history.

(56) References Cited

U.S. PATENT DOCUMENTS 5,834,957 A 11/1998 Staton
6,094,080 A * 7/2000 Jeong ........................ G11C 7/22
365/233.5

(Continued)

FOREIGN PATENT DOCUMENTS

CN 101295971 A 10/2008
CN 101867356 A 10/2010

(Continued)

OTHER PUBLICATIONS

International Search Report received for PCT Patent Application No. PCT/CN2024/079959, mailed on May 21, 2024, 6 pages (3 pages of English Translation and 3 pages of Original Document).

(Continued)

*Primary Examiner* — Menatoallah Youssef
*Assistant Examiner* — Khareem E Almo

(57) ABSTRACT

Embodiments of the present disclosure provide an apparatus and a method for generating a circuit clock signal. The apparatus comprises: a clock buffer configured to buffer an original clock signal to obtain a buffered clock signal; a clock delay unit configured to delay the original clock signal to obtain a plurality of delayed clock signals, the plurality of delayed clock signals being respectively delayed by different amounts of time relative to the original clock signal; a broadened clock generator configured to generate a broadened clock signal based on the original clock signal and the plurality of delayed clock signals, the frequency of the broadened clock signal being lower than that of the original clock signal; and a clock selector configured to select one of the buffered clock signal and the broadened clock signal as the circuit clock signal based on a selection signal.

10 Claims, 5 Drawing Sheets

(56) References Cited

U.S. PATENT DOCUMENTS

| | | | | |
|---|---|---|---|---|
| 6,518,813 B1 * | 2/2003 | Usui | .................... | H04B 15/04 |
| | | | | 327/299 |
| 6,822,499 B2 * | 11/2004 | Ebihara | ................ | H03K 5/133 |
| | | | | 327/299 |
| 7,126,407 B2 * | 10/2006 | Furtner | ................... | H03L 7/22 |
| | | | | 327/159 |
| 7,333,527 B2 * | 2/2008 | Greenstreet | ........... | H04B 15/04 |
| | | | | 327/158 |
| 7,436,235 B2 * | 10/2008 | Nandy | ................. | H04B 15/04 |
| | | | | 327/262 |
| 7,557,630 B2 * | 7/2009 | Kim | ...................... | G11C 7/065 |
| | | | | 327/212 |
| 7,573,932 B2 * | 8/2009 | Kim | ...................... | H03K 5/133 |
| | | | | 713/400 |
| 10,348,307 B2 | 7/2019 | Wang et al. | | |
| 11,106,235 B2 * | 8/2021 | David | .............. | H03K 17/6871 |
| 11,239,846 B1 | 2/2022 | Ur Rahman et al. | | |
| 11,323,124 B1 | 5/2022 | Ur Rahman et al. | | |
| 2007/0069778 A1 * | 3/2007 | Choi | ........................ | G06F 7/68 |
| | | | | 327/158 |

FOREIGN PATENT DOCUMENTS

| | | | |
|---|---|---|---|
| CN | 205407759 | U | 7/2016 |
| CN | 109787593 | A | 5/2019 |
| CN | 112511135 | A | 3/2021 |
| CN | 114244352 | A | 3/2022 |
| CN | 114528111 | A | 5/2022 |
| CN | 115542021 | A | 12/2022 |
| TW | 201015845 | A | 4/2010 |
| TW | 202141932 | A | 11/2021 |
| WO | 2011/063749 | A1 | 6/2011 |

OTHER PUBLICATIONS

Office action received from Taiwan patent application No. 112108086 mailed on Mar. 13, 2013, 12 pages (4 pages English Translation and 8 pages Original Copy).

Office action received from Chinese patent application No. 202310204895.X mailed on Aug. 27, 2025, 15 pages (7 pages English Translation and 8 pages Original Copy).

* cited by examiner

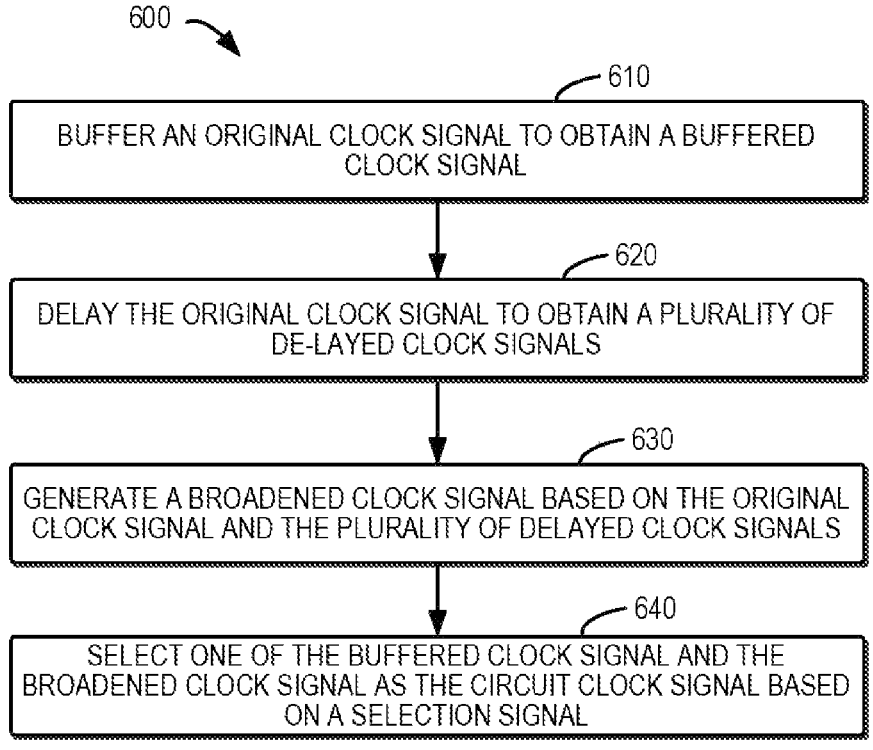

600

610
BUFFER AN ORIGINAL CLOCK SIGNAL TO OBTAIN A BUFFERED
CLOCK SIGNAL

620
DELAY THE ORIGINAL CLOCK SIGNAL TO OBTAIN A PLURALITY OF
DE-LAYED CLOCK SIGNALS

630
GENERATE A BROADENED CLOCK SIGNAL BASED ON THE ORIGINAL
CLOCK SIGNAL AND THE PLURALITY OF DELAYED CLOCK SIGNALS

640
SELECT ONE OF THE BUFFERED CLOCK SIGNAL AND THE
BROADENED CLOCK SIGNAL AS THE CIRCUIT CLOCK SIGNAL BASED
ON A SELECTION SIGNAL

FIG. 6

APPARATUS AND METHOD FOR GENERATING CIRCUIT CLOCK SIGNAL

CROSS REFERENCE

This application is based on Chinese Patent Application No. 202310204895.X, filed on Mar. 6, 2023, and entitled "APPARATUS AND METHOD FOR GENERATING CIRCUIT CLOCK SIGNAL", and claims priority to the Chinese Patent Application. The entirety of the above-mentioned Chinese Patent Application is incorporated herein by reference.

FIELD

Example embodiments of the present disclosure generally relate to the field of electronic circuits, and in particular, to an apparatus and a method for a generating circuit clock signal.

BACKGROUND

In the field of electronic circuits, clock signals are for coordinating the actions of various electronic components to ensure that related electronic components can operate synchronously. In integrated circuits, especially large digital chips such as central processing units (CPUs) and graphics processing units (GPUs), digital circuits might encounter power fluctuations during working. Power fluctuations will cause the timing requirements of some electronic components not to be met, resulting in timing errors. In this case, the clock needs to be adaptively adjusted to avoid timing errors and ensure the correctness of data transmission in order to achieve better performance.

SUMMARY

It is an object of the present disclosure to provide an apparatus and a method for generating a circuit clock signal to at least partially solve the above and other potential problems.

In a first aspect of the present disclosure, there is provided an apparatus for generating a circuit clock signal, comprising: a clock buffer configured to buffer an original clock signal to obtain a buffered clock signal; a clock delay unit configured to delay the original clock signal to obtain a plurality of delayed clock signals, the plurality of delayed clock signals being respectively delayed by different amounts of time relative to the original clock signal; a broadened clock generator configured to generate a broadened clock signal based on the original clock signal and the plurality of delayed clock signals, the frequency of the broadened clock signal being lower than that of the original clock signal; and a clock selector configured to select one of the buffered clock signal and the broadened clock signal as the circuit clock signal based on a selection signal.

In a second aspect of the present disclosure, there is provided a method for generating a circuit clock signal, comprising: buffering an original clock signal to obtain a buffered clock signal; delaying the original clock signal to obtain a plurality of delayed clock signals, the plurality of delayed clock signals being respectively delayed by different amounts of time relative to the original clock signal; generating a broadened clock signal based on the original clock signal and the plurality of delayed clock signals, the frequency of the broadened clock signal being lower than that of the original clock signal; and selecting one of the buffered clock signal and the broadened clock signal as the circuit clock signal based on a selection signal.

It would be appreciated that the content described in the Summary section of the present invention is neither intended to identify key or essential features of the implementations of the present disclosure, nor is it intended to limit the scope of the present disclosure. Other features of the present disclosure will be readily envisaged through the following description.

BRIEF DESCRIPTION OF THE DRAWINGS

The above and other features, advantages and aspects of various embodiments of the present disclosure will become more apparent in combination with the accompanying drawings and with reference to the following detailed description. In the drawings, the same or similar reference numerals refer to the same or similar elements, where:

FIG. 6 shows a flowchart of a method for generating a circuit clock signal according to an embodiment of the present disclosure.

DETAILED DESCRIPTION

The embodiments of the present disclosure will be described in more detail with reference to the accompanying drawings, in which some embodiments of the present disclosure have been illustrated. However, it should be understood that the present disclosure can be implemented in various manners, and thus should not be construed to be limited to embodiments disclosed herein. On the contrary, those embodiments are provided for the thorough and complete understanding of the present disclosure. It should be understood that the drawings and embodiments of the present disclosure are only used for illustration, rather than limiting the protection scope of the present disclosure.

In the description of the embodiments of the present disclosure, the term "comprise" and its variants are to be read as open terms that mean "include, but is not limited to." The term "based on" is to be read as "based at least in part on." The term "one embodiment" or "the embodiment" is to be read as "at least one embodiment." The term "some embodiments" are to be read as "at least some embodiments." Other definitions, explicit and implicit, might be included in the description below.

As described above, in integrated circuits, digital circuits might encounter power fluctuations during working. Power fluctuations will cause the timing requirements of some electronic components not to be met, resulting in timing errors. In this case, the clock needs to be adaptively adjusted to avoid timing errors and ensure the correctness of data transmission. A method for clock adjustment is to adjust the clock by using a phase-locked loop (PLL). However, the adjustment speed of the PLL is slow and cannot meet the need for fast adaptive adjustment. In some cases, two PLLs can be used to generate two clock frequencies to dynamically provide different clock signals. However, the setting of two PLLs will cause a large waste of resources. The embodiments of the present disclosure provide a solution for generating a circuit clock signal, in which a plurality of delayed clock signals are obtained by delaying an original clock signal, then a broadened clock signal is generated based on the original clock signal and the plurality of delayed clock signals, and the broadened clock signal can be dynamically selected as the circuit clock signal in the event of power fluctuations. In this way, rapid adaptive adjustment of the clock can be achieved to avoid timing errors and ensure the correctness of data transmission, thereby achieving better performance of the circuit. The principles of the present disclosure will be described in detail below with reference to FIGS. 1 to 6.

Figure 1:
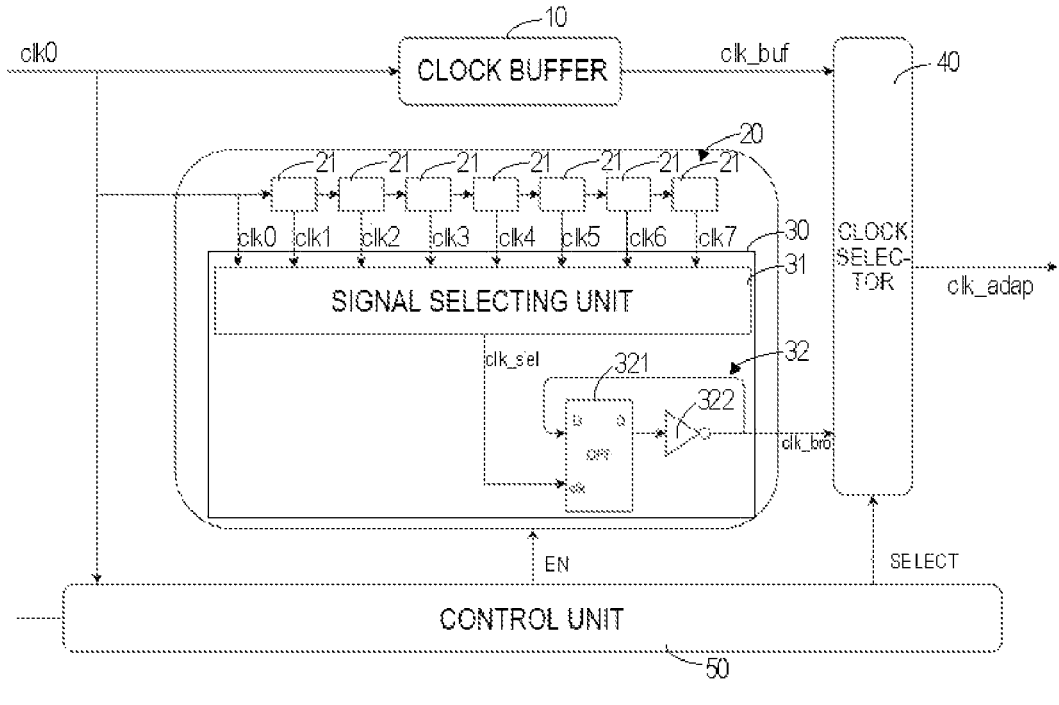
FIG. 1 shows a circuit schematic diagram of an apparatus for generating a circuit clock signal according to an embodiment of the present disclosure.

FIG. 1 shows a circuit schematic diagram of an apparatus for generating a circuit clock signal according to an embodiment of the present disclosure. As shown in FIG. 1, the apparatus described herein generally includes a clock buffer 10, a clock delay unit 20, a broadened clock generator 30, a clock selector 40 and a control unit 50.

The clock buffer 10 is used to buffer an original clock signal clk0 to obtain a buffered clock signal clk_buf. The original clock signal clk0 is a clock signal used by the circuit under normal operation, which has a predetermined clock frequency, for example, has a predetermined frequency value or is within a predetermined frequency range. The clock buffer 10 may use any suitable clock buffering technique to buffer the original clock signal clk0. In some embodiments, the clock buffer 10 may include a multi-stage inverter. The multi-stage inverter may invert the original clock signal clk0 multiple times, thereby buffering and enhancing the original clock signal clk0 and improving the drive capability of the clock signal.

It should be understood that the clock buffering methods described above are merely examples and are not intended to limit the embodiments of the present disclosure in any way. Any clock buffering technique that is currently known or to be developed in the future may be used in conjunction with the embodiments of the present disclosure.

The clock delay unit 20 is used to delay the original clock signal clk0 to obtain a plurality of delayed clock signals clk1-clk7. The delayed clock signals clk1-clk7 are each delayed by different amounts of time relative to the original clock signal clk0. FIG. 1 shows seven delayed clock signals clk1-clk7 generated by the clock delay unit 20 for illustrating the principles of the present disclosure. The clock delay unit 20 may use any suitable clock delay technique to delay the original clock signal clk0. It should be noted that the numbers, values and so on mentioned above and elsewhere in the present disclosure are exemplary and are not intended to limit the scope of the present disclosure in any way. Any other suitable number or value is possible.

In some embodiments, as shown in FIG. 1, the clock delay unit 20 includes a plurality of delay components 21 connected in sequence. The number of delay components 21 is equal to the number of delayed clock signals clk1-clk7. For example, the clock delay unit 20 shown in FIG. 1 includes seven delay components 21 for generating seven delayed clock signals clk1-clk7. In other embodiments, the clock delay unit 20 may include more or fewer delay components 21 for generating a corresponding number of delayed clock signals.

As shown in FIG. 1, the original clock signal clk0 is provided to a first delay component of the plurality of delay components 21. Each of the plurality of delay components 21 provides a corresponding delayed one of the delayed clock signals clk1-clk7. For example, the first delay component of the plurality of delay components 21 may delay the original clock signal clk0 to provide a delayed clock signal clk1. A second delay component may delay the delayed clock signal clk1 to provide a delayed clock signal clk2. A third delay component may delay the delayed clock signal clk2 to provide a delayed clock signal clk3. A fourth delay component may delay the delayed clock signal clk3 to provide a delayed clock signal clk4. A fifth delay component may delay the delayed clock signal clk4 to provide a delayed clock signal clk5. A sixth delay component may delay delayed the clock signal clk5 to provide a delayed clock signal clk6. A seventh delay component may delay the delayed clock signal clk6 to provide a delayed clock signal clk7. In this way, a plurality of delayed clock signals can be reliably and sequentially generated, and such a clock delay unit 20 has a simple structure and low cost.

Each of the plurality of delay components 21 may use any suitable clock delay technique to delay the clock signal. For example, in some embodiments, the delay component 21 may use a buffer to delay the clock signal. In other embodiments, the delay component 21 may use a multi-stage inverter to delay the clock signal. In some more embodiments, the delay component 21 may delay the clock signal using a resistor-capacitor (RC) delay component. It should be understood that the above structure of the delay component 21 is only an example and is not intended to limit the embodiments of the present disclosure in any way. Any clock delay technique that is currently known or to be developed in the future may be used in conjunction with the embodiments of the present disclosure.

Figure 2:
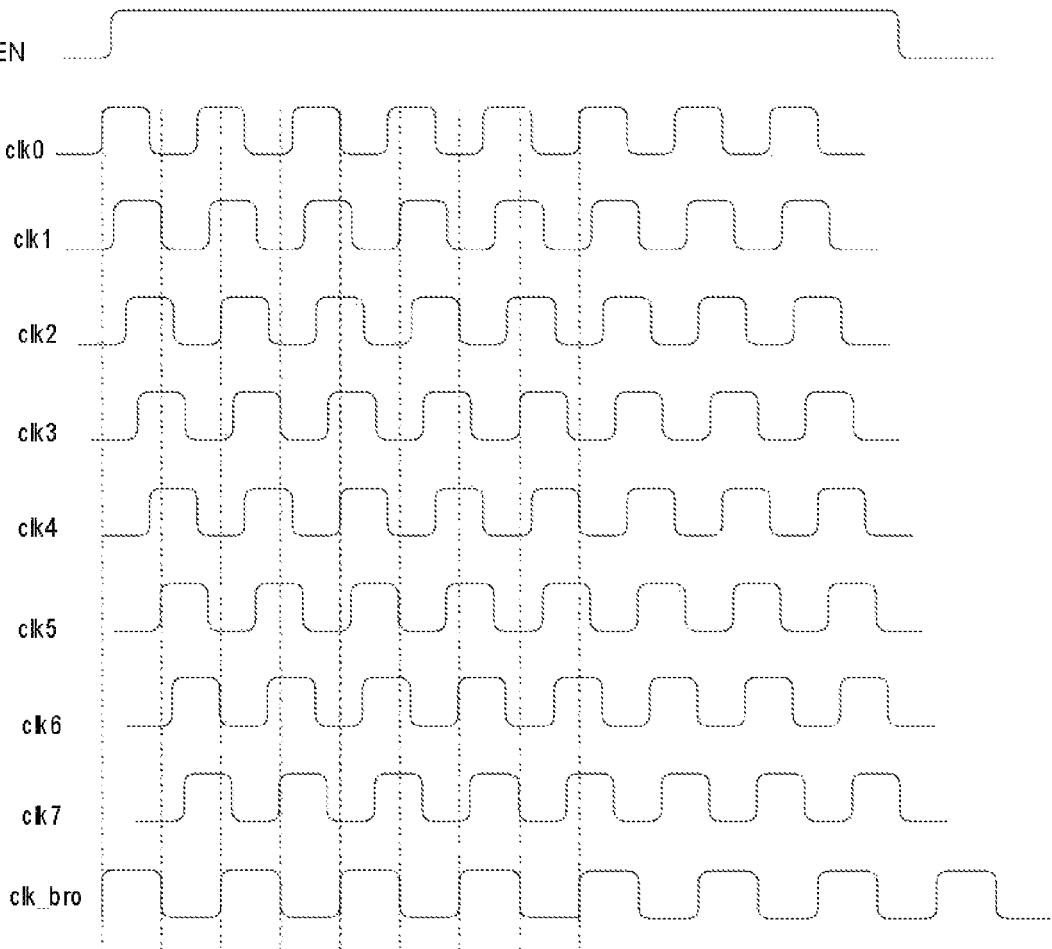
FIG. 2 shows a timing diagram of an original clock signal, a plurality of delayed clock signals and a broadened clock signal according to an embodiment of the present disclosure.

In some embodiments, each of the plurality of delay components 21 may provide the same amount of delay. For example, each delay component 21 shown in FIG. 1 may provide a delay amount of 12.5% of THE clock cycle. FIG. 2 shows a timing diagram of the original clock signal clk0 and the plurality of delayed clock signals clk1-clk7. As shown in FIG. 2, the clock signal clk1 is delayed by 12.5% of the clock cycle relative to the original clock signal clk0, the clock signal clk2 is delayed by 25% of the clock cycle relative to the original clock signal clk0, the clock signal clk3 is delayed by 37.5% of the clock cycle relative to the original clock signal clk0, the clock signal clk4 is delayed by 50% of the clock cycle relative to the original clock signal clk0, the clock signal clk5 is delayed by 62.5% of the clock cycle relative to the original clock signal clk0, the clock signal clk6 is delayed by 75% of the clock cycle relative to the original clock signal clk0, and the clock signal clk7 is delayed by 87.5% of the clock cycle relative to the original clock signal clk0. It should be understood that in a case that the clock delay unit 20 includes more or fewer delay components 21, each delay component 21 may provide an amount of delay of other values.

Alternatively, in some embodiments, the plurality of delay components 21 can provide different amounts of delay, which can be selected according to circuit design and actual needs. The embodiments of the present disclosure do not limit in this regard.

In some embodiments, the clock delay unit 20 may include a plurality of individual delay components, rather than a plurality of delay components connected sequentially as shown in FIG. 1, to respectively provide corresponding delayed clock signals. This arrangement can also provide a plurality of delayed clock signals, but is more complex and costly than the structure shown in FIG. 1.

It should be understood that the above-described structure of the clock delay unit 20 is merely exemplary and is not intended to limit the embodiments of the present disclosure in any way. Any clock delay technique that is currently known or to be developed in the future may be used in conjunction with the embodiments of the present disclosure.

The broadened clock generator 30 is used to generate a broadened clock signal clk_bro based on the original clock signal clk0 and the plurality of delayed clock signals clk1-clk7. The frequency of the broadened clock signal clk_bro is lower than that of the original clock signal clk0. An exemplary timing diagram of the broadened clock signal clk_bro is shown in FIG. 2. As depicted, the frequency of the broadened clock signal clk_bro is lower than that of the original clock signal clk0, and the time length of a single clock cycle of the broadened clock signal clk_bro is greater than that of a single clock cycle of the original clock signal clk0. The broadened clock generator 30 may generate the broadened clock signal clk_bro based on the original clock signal clk0 and the plurality of delayed clock signals clk1-clk7 using any suitable clock broadening technique.

For example, in some embodiments, as shown in FIG. 1, the broadened clock generator 30 includes a signal selecting unit 31 and a clock broadening unit 32. The signal selecting unit 31 is used to cyclically select a clock signal from the original clock signal clk0 and the plurality of delayed clock signals clk1-clk7 in a predetermined order. The clock broadening unit 32 is used to generate the broadened clock signal clk_bro based on a clock signal clk_sel selected by the signal selecting unit 31.

Figure 3:
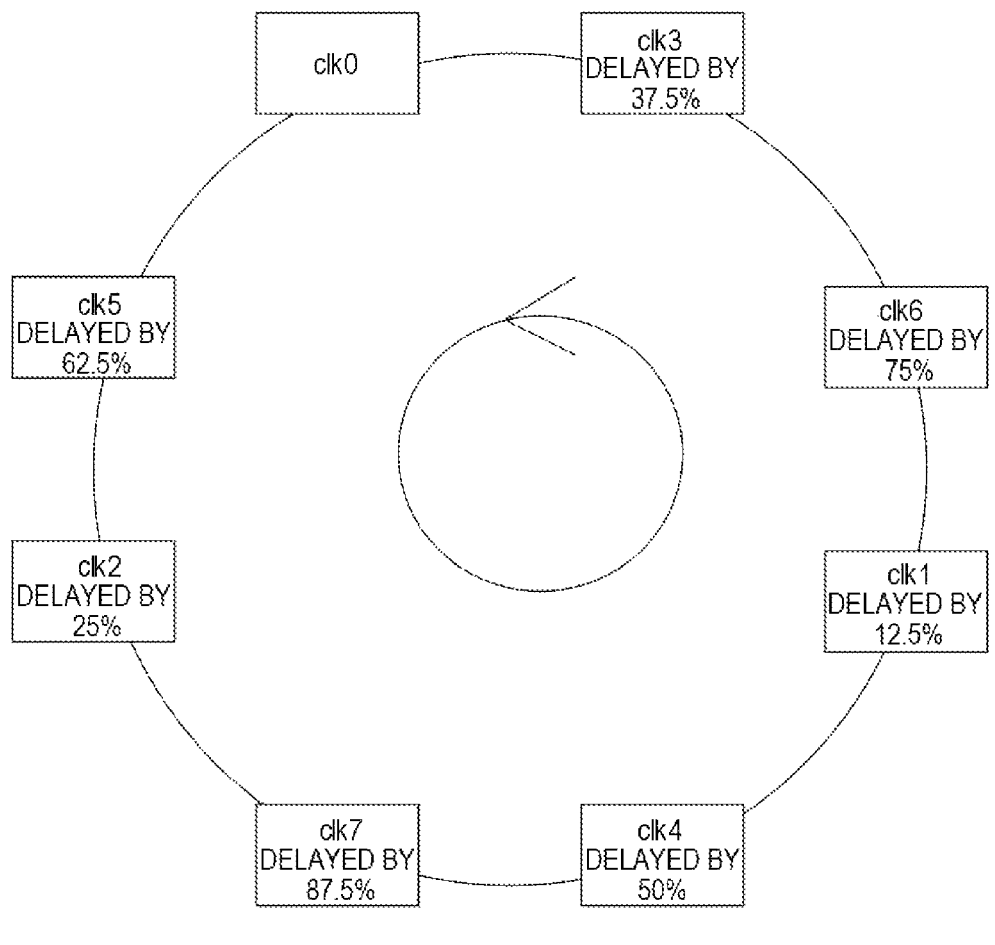
FIG. 3 shows a predetermined order of cyclically selecting a clock signal from an original clock signal and a plurality of delayed clock signals according to an embodiment of the present disclosure.

FIG. 3 shows a predetermined order of cyclically selecting a clock signal from the original clock signal clk0 and the plurality of delayed clock signals clk1-clk7 according to an embodiment of the present disclosure. As shown in FIG. 3, the signal selecting unit 31 cyclically selects a clock signal from the original clock signal clk0 and the plurality of delayed clock signals clk1-clk7 in a counterclockwise sequence indicated by an arrow. Specifically, the signal selecting unit 31 first selects the original clock signal clk0, and then selects the delayed clock signals clk5, clk2, clk7, clk4, clk1, clk6 and clk3 in this order. Subsequently, the signal selecting unit 31 selects the original clock signal clk0 again, thereby entering the next selection cycle.

Figure 4:
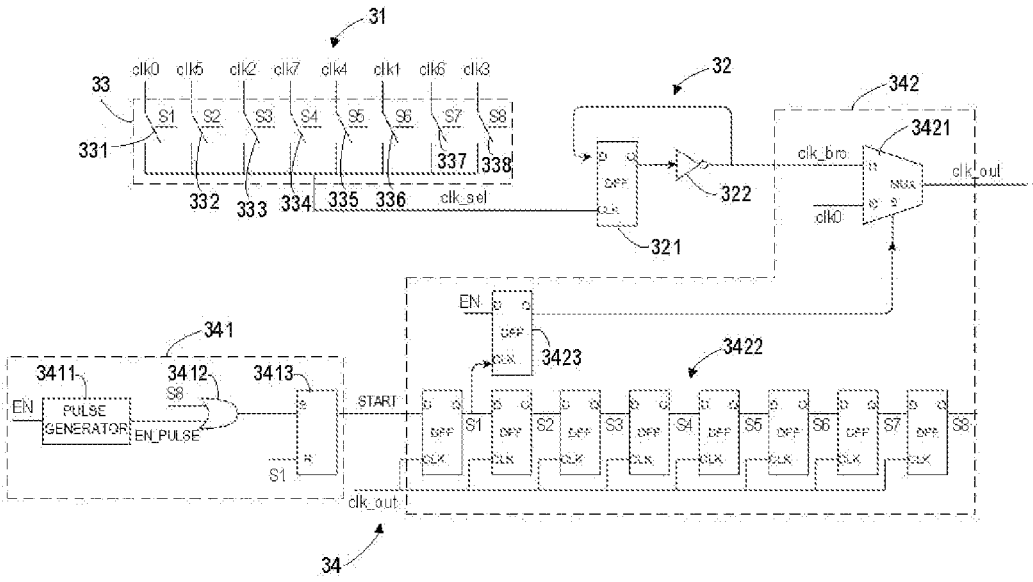
FIG. 4 shows a circuit schematic diagram of a broadened clock generator according to an embodiment of the present disclosure.

The signal selecting unit 31 may use various implementations to cyclically select a clock signal from the original clock signal clk0 and the plurality of delayed clock signals clk1-clk7. As an example, FIG. 4 shows an example implementation of the signal selecting unit 31. As depicted, the signal selecting unit 31 includes a switch matrix 33 and a switch matrix control unit 34. The switch matrix 33 includes a plurality of switches, such as first to eighth switches 331 to 338. In conjunction with FIG. 1, one end of each of the first to eighth switches 331 to 338 is coupled to the clock delay unit 20 to receive a corresponding clock signal among the original clock signal clk0 and the plurality of delayed clock signals clk1-clk7. Specifically, one end of the first switch 331 is used to receive the original clock signal clk0, one end of the second switch 332 is used to receive the delayed clock signal clk5, one end of the third switch 333 is used to receive the delayed clock signal clk2, one end of the fourth switch 334 is used to receive the delayed clock signal clk7, one end of the fifth switch 335 is used to receive the delayed clock signal clk4, one end of the sixth switch 336 is used to receive the delayed clock signal clk1, one end of the seventh switch 337 is used to receive the delayed clock signal clk6, and one end of the eighth switch 338 is used to receive the delayed clock signal clk3. The other end of each switch is coupled to the clock broadening unit 32 to provide the clock signal clk_sel selected by the signal selecting unit 31 to the clock broadening unit 32. With this arrangement, a clock signal can be stably and reliably selected cyclically from the original clock signal clk0 and the plurality of delayed clock signals clk1-clk7, and the circuit structure is simple and the implementation cost is low.

In some embodiments, the clock signal may be cyclically selected from the original clock signal clk0 and the plurality of delayed clock signals clk1-clk7 by cyclically controlling the on-off state of the switches 331-338. The on-off state of the first to eighth switches 331 to 338 can be controlled by corresponding control signals S1 to S8. For example, the on-off state of the first switch 331 can be controlled by the control signal S1. As an example, when the control signal S1 is 0 (low level), the first switch 331 is turned off, and when the control signal S1 is 1 (high level), the first switch 331 is turned on. As another example, when the control signal S1 is 1, the first switch 331 may be turned off, and when the control signal S1 is 0, the first switch 331 may be turned on. Similarly, by changing the level of the control signals S2-S8, the on-off state of a corresponding switch among the second to eighth switches 332 to 338 can be changed.

The control signals S1 to S8 may be provided by the switch matrix control unit 34. As shown in FIG. 4, the switch matrix control unit 34 can generate the control signals S1 to S8 based on an enable signal EN to control the first switch 331 to the eighth switch 338 to be turned on sequentially and cyclically, so that the original clock signal clk0 and the plurality of delayed clock signals clk1-clk7 are cyclically selected by the signal selecting unit 31 in a predetermined order as shown in FIG. 3. The switch matrix control unit 34 may generate the control signals S1 to S8 in any suitable manner.

The enable signal EN can be provided in various ways. For example, returning to FIG. 1, the enable signal EN may be provided by a control unit 50. In some embodiments, in a case that the clock signal in the integrated circuit needs to be adaptively adjusted, e.g., in the event of power fluctuations occur or due to power consumption requirements or functional requirements for the integrated circuit, the control unit 50 may provide an enable signal EN at a high level to the switch matrix control unit 34 initiate the generation of the control signals S1 to S8. In a case that the clock signal in the integrated circuit does not need to be adaptively adjusted, the control unit 50 may provide an enable signal EN at a low level to the switch matrix control unit 34. An exemplary level logic of the enable signal EN is shown in FIG. 2. It should be understood that in other embodiments, the control unit 50 may provide the enable signal EN with reverse level logic.

For example, in some embodiments, as shown in FIG. 4, the switch matrix control unit 34 includes a starting unit 341 and a switch signal generating unit 342. The starting unit 341 is used to generate a broadening start signal START based on the enable signal EN, and the broadening start signal START is used to control the switch signal generating unit 342 to start generating the control signals S1 to S8. The switch signal generating unit 342 is used to generate corresponding control signals S1 to S8 for controlling the on-off state of the first to eighth switches 331 to 338 based on the broadening start signal START, so as to cause the first to eighth switches 331 to 338 to be turned on in turn. With this arrangement, the on state of the plurality of switches in the switch matrix 33 can be accurately controlled, and such a circuit structure is simple and has a low cost.

In some embodiments, as shown in FIG. 4, the starting unit 341 includes a pulse generator 3411, an OR gate 3412, and a set-reset (SR) latch 3413. The pulse generator 3411 is used to generate a pulse signal EN_PULSE based on the enable signal EN. One input end of the OR gate 3412 is connected to the output end of the pulse generator 3411 to receive the pulse signal EN_PULSE. The other input end of the pulse generator 3411 receives the control signal S8 of the last switch (for example, the eighth switch 338) among the switches of the switch matrix 33. The S input end (i.e., the set end) of the SR latch 3413 is connected to the output end of the OR gate 3412. The R input end (i.e., the reset end) of the SR latch 3413 receives the control signal S1 of the first switch (i.e., the first switch 331) among the switches of the switch matrix 33. The output end of the SR latch 3413 provides the broadening start signal START.

In the event of receiving the broadening start signal START, the switch signal generating unit 342 starts generating control signals for the plurality of switches included in the switch matrix 33, such as the control signals S1 to S8. In an embodiment, as shown in FIG. 4, the switch signal generating unit 342 includes a multiplexer 3421, a plurality of D flip-flops 3422 connected in series, and a first additional D flip-flop 3423.

One input end of the multiplexer 3421 receives the broadened clock signal clk_bro, and the other input end of the multiplexer 3421 receives the original clock signal clk0. The multiplexer 3421 is used to select one of the broadened clock signal clk_bro and the original clock signal clk0 based on the selection control signal on the selection control end S, and provide a selection result at its output end clk_out. In some embodiments, the multiplexer 3421 selects the broadened clock signal clk_bro in a case that the selection control signal on the selection control end S is 1, and selects the original clock signal clk0 in a case that the selection control signal on the selection control end S is 0. It should be understood that the opposite selection logic is also possible.

The D input end of the first D flip-flop among the plurality of D flip-flops 3422 connected in series is connected to the output end of the SR latch 3413 to receive the broadening start signal START. Among the plurality of D flip-flops 3422, other D flip-flops except the first D flip-flop are connected in sequence after the first D flip-flop. That is, the D input ends of other D flip-flops except the first D flip-flop in the plurality of D flip-flops 3422 are connected to the Q output end of the previous D flip-flop. The clock input end CLK of the plurality of D flip-flops 3422 is connected to the output end clk_out of the multiplexer 3421. The Q output ends of the plurality of D flip-flops 3422 respectively provide control signals for a plurality of switches included in the switch matrix 33, such as the control signals S1 to S8.

The clock input end of the first additional D flip-flop 3423 is connected to the Q output end of the first D flip-flop in the plurality of D flip-flops 3422. The D input end of the first additional D flip-flop 3423 receives the enable signal EN. The Q output end of the first additional D flip-flop 3423 is connected to the selection control end S of the multiplexer 3421.

The switch signal generating unit 342 as described above adopts specially designed control logic to provide accurate switch control signals to ensure that the plurality of switches in the switch matrix 33 are turned on in a predetermined order. In addition, such a circuit structure is simple and easy to implement.

As described above, the clock broadening unit 32 is used to generate the broadened clock signal clk_bro based on the clock signal clk_sel selected by the signal selecting unit 31. The clock broadening unit 32 may use any suitable clock broadening technique to broaden the clock signal.

For example, in some embodiments, as shown in FIG. 4, the clock broadening unit 32 includes a second additional D flip-flop 321 and an inverter 322. The clock input end CLK of the second additional D flip-flop 321 is connected to the output end of the signal selecting unit 31 to receive the clock signal clk_sel selected by the signal selecting unit 31. The input end of the inverter 322 is connected to the Q output end of the second additional D flip-flop 321. The output end of the inverter 322 is connected to the D input end of the second additional D flip-flop 321. The output end of inverter the 322 provides the broadened clock signal clk_bro.

Example operation of the broadened clock generator 30 will be described below in conjunction with FIG. 4.

As shown in FIG. 4, when the enable signal EN at a high level (logic 1) is provided to the pulse generator 3411, the pulse generator 3411 generates the pulse signal EN_PULSE. The pulse signal EN_PULSE is applied to the SR latch 3413 via the OR gate 3412, so that the SR latch 3413 is set to 1, thereby causing the broadening start signal START to become 1. At this time, since the selection control signal on the selection control end S of the multiplexer 3421 is 0, the multiplexer 3421 provides the original clock signal clk0 to the clock input ends CLK of the plurality of D flip-flops 3422. When the rising edge of the original clock signal clk0 arrives, the first D flip-flop among the plurality of D flip-flops 3422 causes the control signal S1 to become 1, while the control signals S2-S8 are still 0. Thereby, the first switch 331 is caused to be turned on, while the second switch 332 to the eighth switch 338 are still off. When the control signal S1 becomes 1, the selection control signal on the selection control end S of the multiplexer 3421 also becomes 1, so that the multiplexer 3421 provides the broadened clock signal clk_bro to the clock input ends CLK of the plurality of D flip-flops 3422. When a rising edge of the broadened clock signal clk_bro arrives, the plurality of D flip-flops 3422 cause the control signal S1 to become 0 and cause the control signal S2 to become 1, and the control signals S3-S8 are still 0, so that the second switch 332 is caused to be turned on while the remaining switches are off. When the next rising edge of the broadened clock signal clk_bro arrives, the plurality of D flip-flops 3422 cause the control signal S2 to become 0 and cause the control signal S3 to become 1, and the control signals S1 and S4-S8 are still 0, so that the third switch 333 is caused to be turned on while the remaining switches are turned off. In this way, the control signals S1-S8 can be cyclically changed to 1 in sequence, so that the first switch 331 to the eighth switch 338 are cyclically turned on in sequence.

Furthermore, as shown in FIG. 4, when the first switch 331 is turned on, the original clock signal clk0 is provided to the clock input end CLK of the second additional D flip-flop 321. In conjunction with FIG. 2, when the rising edge of the original clock signal clk0 arrives, the second additional D flip-flop 321 and the inverter 322 cause the broadened clock signal clk_bro to become 1. When the second switch 332 is turned on, the delayed clock signal clk5 is provided to the clock input end CLK of the second additional D flip-flop 321. In conjunction with FIG. 2, when the rising edge of the delayed clock signal clk5 arrives, the second additional D flip-flop 321 and the inverter 322 cause the broadened clock signal clk_bro to become 0. When the third switch 333 is turned on, the delayed clock signal clk2 is provided to the clock input end CLK of the second additional D flip-flop 321. In conjunction with FIG. 2, when the rising edge of the delayed clock signal clk2 arrives, the second additional D flip-flop 321 and the inverter 322 cause the broadened clock signal clk_bro to become 1. When the fourth switch 334 is turned on, the delayed clock signal clk7 is provided to the clock input end CLK of the second additional D flip-flop 321. In conjunction with FIG. 2, when the rising edge of the delayed clock signal clk7 arrives, the second additional D flip-flop 321 and the inverter 322 cause the broadened clock signal clk_bro to become 0. In this way, by sequentially turning on the first to eighth switches 331 to 338, the second additional D flip-flop 321 and the inverter 322 can cause the level of the broadened clock signal clk_bro to switch between 1 and 0. As shown in FIG. 2, the frequency of the broadened clock signal clk_bro is lower than that of the original clock signal clk0, and the time length of a single clock cycle of the broadened clock signal clk_bro is greater than that of a single clock cycle of the original clock signal clk0.

Returning to FIG. 1, the clock selector 40 is connected to the clock buffer 10 and the broadened clock generator 30 for selecting one of the buffered clock signal clk_buf and the broadened clock signal clk_bro as a circuit clock signal clk_adap based on the selection signal SELECT.

The selection signal SELECT can be provided in various ways. For example, returning to FIG. 1, the selection signal SELECT may be provided by the control unit 50. In some embodiments, in a case that the clock signal in the integrated circuit needs to be adaptively adjusted, e.g., in the event of power fluctuations occur or due to power consumption requirements or functional requirements for the integrated circuit, the control unit 50 may provide the selection signal SELECT at a high level to the clock selector 40, so that the clock selector 40 selects the broadened clock signal clk_bro as the circuit clock signal clk_adap. In a case that the clock signal in the integrated circuit does not need to be adaptively adjusted, the control unit 50 can provide the selection signal SELECT at a low level to the clock selector 40, so that the clock selector 40 selects the buffered clock signal clk_buf as the circuit clock signal clk_adap. It should be understood that in other embodiments, the control unit 50 may also provide the selection signal SELECT with opposite level logic. In this case, the clock selector 40 may select the broadened clock signal clk_bro as the circuit clock signal clk_adap when the control unit 50 provides the selection signal SELECT at a low level, and may select the buffered clock signal clk_buf as the circuit clock signal clk_adap when the control unit 50 provides the selection signal at a high level.

In an embodiment, the clock selector 40 may include a glitch-free multiplexer. In other embodiments, the clock selector 40 can further be implemented in other ways, and the embodiments of the present disclosure do not limit in this regard.

Figure 5:
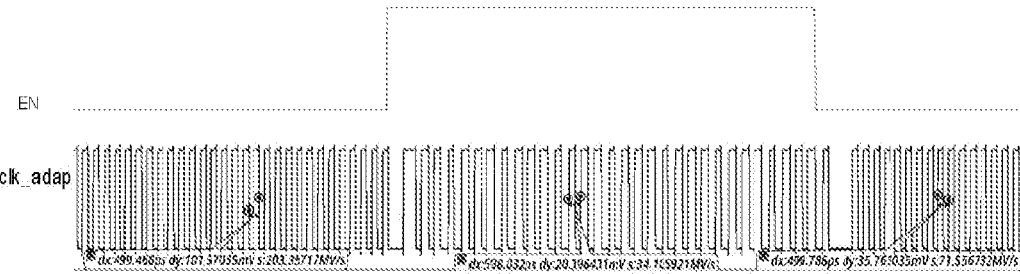
FIG. 5 shows a timing diagram of a circuit clock signal according to an embodiment of the present disclosure.

FIG. 5 shows a timing diagram of a circuit clock signal according to an embodiment of the present disclosure. As depicted, when the enable signal EN is at a low level, the original clock signal clk0 is used as the circuit clock signal clk_adap, and its clock cycle is approximately 499.468 picoseconds (ps). When the enable signal EN changes to a high level, the broadened clock signal clk_bro is used as the circuit clock signal clk_adap, and its clock cycle after stabilization is about 598.032 ps. It can be seen that in the embodiments according to the present disclosure, in a case that the clock signal in the integrated circuit needs to be adaptively adjusted, the clock signal can be quickly broadened, the data can be processed at a slower clock frequency to avoid timing errors and ensure the correctness of data transmission. In addition, compared with conventional solutions that use two PLLs to generate two clock frequencies, the embodiments of the present disclosure can achieve adaptive adjustment of clock signals at a lower cost.

An embodiment of the present disclosure further provides a method 600 for generating a circuit clock signal, as shown in FIG. 6. The method 600 may be performed by the apparatus for generating a circuit clock signal described above in conjunction with FIGS. 1 to 5. As shown in FIG. 6, the method 600 includes: at block 610, buffering the original clock signal clk0 to obtain a buffered clock signal clk_buf; at block 620, delaying the original clock signal clk0 to obtain a plurality of delayed clock signals clk_buf, wherein the plurality of delayed clock signals clk1-clk7 are respectively delayed by different amounts of time relative to the original clock signal clk0; at block 630, based on the original clock signal clk0 and the plurality of delayed clock signals clk1-clk7 generating a broadened clock signal clk_bro having a frequency lower than the frequency of the original clock signal clk0; and at block 640, selecting one of the buffered clock signal clk_buf and the broadened clock signal clk_bro based on the selection signal SELECT as a circuit clock signal clk_adap.

In some embodiments, the delaying the original clock signal clk0 includes: delaying the original clock signal clk0 by a plurality of delay components 21 connected in sequence, wherein the number of delay components 21 is equal to the number of delayed clock signals, the original clock signal clk0 is provided to a first delay component of the plurality of delay components 21, and each of the plurality of delay components 21 respectively provides a corresponding delayed clock signal of the plurality of delayed clock signals clk1-clk7.

In some embodiments, the generating the broadened clock signal clk_bro based on the original clock signal clk0 and the plurality of delayed clock signals clk1-clk7 includes: cyclically selecting, by the signal selecting unit 31, a clock signal from the original clock signal clk0 and the plurality of delayed clocks in a predetermined order; and generating the broadened clock signal clk_bro by the clock broadening unit 32 based on the clock signal clk_sel selected by the signal selecting unit 31.

In some embodiments, the cyclically selecting, by the signal selecting unit 31, the clock signal from the original clock signal clk0 and the plurality of delayed clock signals clk1-clk7 in a predetermined order includes: controlling, by the switch matrix control unit 34 based on the enable signal EN, a plurality of switches of the switch matrix 33 to be cyclically turned on in sequence, so that the original clock signal clk0 and the plurality of delayed clock signals clk1-clk7 are selected by the signal selecting unit 31 in a predetermined order, wherein one end of each of the plurality of switches is coupled to the clock delay unit 20 receives a corresponding clock signal among the plurality of delayed clock signals clk1-clk7 and the original clock signal clk0, and the other end of each of the plurality of switches is coupled to the clock broadening unit 32, so that the clock signal selected by the signal selecting unit 31 is provided to the clock broadening unit 32.

In some embodiments, the controlling, by the switch matrix control unit 34 based on the enable signal EN, the plurality of switches of the switch matrix 33 to be cyclically turned on in sequence includes: generating the broadening start signal START based on the enable signal EN by the starting unit 341; and generating, by the switch signal generating unit 342 based on the broadening start signal START, corresponding control signals for controlling the plurality of switches, so that the plurality of switches are cyclically turned on in sequence.

The embodiments of the present disclosure are also embodied in the following examples.

Example 1. An apparatus for generating a circuit clock signal, comprising:

a clock buffer configured to buffer an original clock signal to obtain a buffered clock signal;

a clock delay unit configured to delay the original clock signal to obtain a plurality of delayed clock signals, the plurality of delayed clock signals being respectively delayed by different amounts of time relative to the original clock signal;

a broadened clock generator configured to generate a broadened clock signal based on the original clock signal and the plurality of delayed clock signals, the frequency of the broadened clock signal being lower than that of the original clock signal; and a clock selector configured to select one of the buffered clock signal and the broadened clock signal as the circuit clock signal based on a selection signal.

Example 2. The apparatus of Example 1, wherein the clock delay unit includes a plurality of delay components connected in sequence, the number of the delay components is equal to the number of the delayed clock signals, the original clock signal is provided to a first delay component of the plurality of delay components, and each of the plurality of delay components respectively provides a respective delayed clock signal of the plurality of delayed clock signals.

Example 3. The apparatus of example 2, wherein each of the plurality of delay components is configured to provide the same amount of delay.

Example 4. The apparatus of example 1, wherein the broadened clock generator includes:

a signal selecting unit configured to cyclically select a clock signal from the original clock signal and the plurality of delayed clock signals in a predetermined order; and a clock broadening unit configured to generate the broadened clock signal based on the clock signal selected by the signal selecting unit.

Example 5. The apparatus of example 4, wherein the signal selecting unit includes:

a switch matrix, including a plurality of switches, one end of each of the plurality of switches being coupled to the clock delay unit to receive a corresponding clock signal among the original clock signal and the plurality of delayed clock signals, the other end of each of the plurality of switches being coupled to the clock broadening unit to provide the clock signal selected by the signal selecting unit to the clock broadening unit; and a switch matrix control unit configured to control the plurality of switches to be cyclically turned on in sequence based on an enable signal, so that the original clock signal and the plurality of delayed clock signals are selected by the signal selecting unit in the predetermined order.

Example 6. The apparatus of example 5, wherein the switch matrix control unit includes:

a starting unit configured to generate a broadening start signal based on the enable signal; and a switch signal generating unit configured to generate corresponding control signals for controlling the plurality of switches based on the broadening start signal, so that the plurality of switches are cyclically turned on in sequence.

Example 7. The apparatus of example 6, wherein the starting unit includes:

a pulse generator configured to generate a pulse signal based on the enable signal;

an OR gate, one input end of which receives the pulse signal, and the other input end of which receives the control signal of the last switch in the plurality of switches; and an SR latch, an S input end of which is connected to an output end of the OR gate, an R input end of which receives the control signal of the first switch in the plurality of switches, and an output end of which provides the broadening start signal.

Example 8. The apparatus of example 6, wherein the switch signal generating unit includes:

a multiplexer, one input end of which receives the broadened clock signal, and the other input end of which receives the original clock signal;

a plurality of D flip-flops connected in series, wherein a D input end of the first D flip-flop in the plurality of D flip-flops receives the broadening start signal, D input ends of D flip-flops other than the first D flip-flop among the plurality of D flip-flops are connected to Q output ends of previous D flip-flops, clock input ends of the plurality of D flip-flops are connected to output ends of the multiplexer, and Q output ends of the plurality of D flip-flops respectively provide the control signals for the plurality of switches; and a first additional D flip-flop, a clock input end of which is connected to the Q output end of the first D flip-flop, a D input end of which receives the enable signal, and a Q output end of which is connected to a selection control end of the multiplexer.

Example 9. The apparatus of example 4, wherein the clock broadening unit includes:

a second additional D flip-flop, a clock input end of which receives the clock signal selected by the signal selecting unit; and an inverter, an input end of which is connected to a Q output end of the second additional D flip-flop, an output end of which is connected to a D input end of the second additional D flip-flop, and an output end of which provides the broadened clock signal.

Example 10. A method for generating a circuit clock signal, comprising:

buffering an original clock signal to obtain a buffered clock signal;

delaying the original clock signal to obtain a plurality of delayed clock signals, the plurality of delayed clock signals being respectively delayed by different amounts of time relative to the original clock signal;

generating a broadened clock signal based on the original clock signal and the plurality of delayed clock signals, the frequency of the broadened clock signal being lower than that of the original clock signal; and selecting one of the buffered clock signal and the broadened clock signal as the circuit clock signal based on a selection signal.

Example 11. The method of Example 11, wherein the delaying the original clock signal includes:

delaying the original clock signal by a plurality of delay components connected in sequence, wherein the number of the delay components is equal to the number of the delayed clock signals, the original clock signal is provided to a first delay component of the plurality of delay components, and each of the plurality of delay components respectively provides a respective delayed clock signal of the plurality of delayed clock signals.

Example 12. The method of example 10, wherein the generating the broadened clock signal based on the original clock signal and the plurality of delayed clock signals includes:

cyclically selecting, by a signal selecting unit, a clock signal from the original clock signal and the plurality of delayed clock signals in a predetermined order; and generating, by a clock broadening unit, the broadened clock signal based on the clock signal selected by the signal selecting unit.

Example 13. The method of example 12, wherein the cyclically selecting, by a signal selecting unit, the clock signal from the original clock signal and the plurality of delayed clock signals in a predetermined order includes:

controlling, by a switch matrix control unit, a plurality of switches of a switch matrix to be cyclically turned on in sequence based on an enable signal, so that the original clock signal and the plurality of delayed clock signals are selected by the signal selecting unit in the predetermined order, wherein one end of each of the plurality of switches is coupled to the clock delay unit to receive a corresponding clock signal among the original clock signal and the plurality of delayed clock signals, the other end of each of the plurality of switches is coupled to the clock broadening unit to provide the clock signal selected by the signal selecting unit to the clock broadening unit.

Example 14. The method of example 13, wherein the controlling, by the switch matrix control unit, the plurality of switches of the switch matrix to be cyclically turned on in sequence based on the enable signal includes:

generating, by a starting unit, a broadening start signal based on the enable signal; and generating, by a switch signal generating unit, corresponding control signals for controlling the plurality of switches based on the broadening start signal, so that the plurality of switches are cyclically turned on in sequence.

Various implementations of the present disclosure have been described above. However, the foregoing illustration is merely exemplary but not exhaustive, and is not limited to the disclosed implementations. Many modifications and alterations are apparent to those of ordinary skill in the art without departing from the scope and spirit of the implementations described herein. The terminology used herein is intended to best explain the principles, practical applications of the various implementations, or improvements to technology in the market, or to enable others of ordinary skill in the art to understand the various implementations disclosed herein.

What is claimed is:

1. An apparatus for generating a circuit clock signal, comprising:

a clock buffer configured to buffer an original clock signal to obtain a buffered clock signal;

a clock delay unit configured to delay the original clock signal to obtain a plurality of delayed clock signals, the plurality of delayed clock signals being respectively delayed by different amounts of time relative to the original clock signal;

a broadened clock generator configured to generate a broadened clock signal based on the original clock signal and the plurality of delayed clock signals, the frequency of the broadened clock signal being lower than that of the original clock signal; and a clock selector configured to select one of the buffered clock signal and the broadened clock signal as the circuit clock signal based on a selection signal, wherein the broadened clock generator comprises:

a signal selecting unit configured to cyclically select a clock signal from the original clock signal and the plurality of delayed clock signals in a predetermined order; and a clock broadening unit configured to generate the broadened clock signal based on the clock signal selected by the signal selecting unit, and wherein the signal selecting unit comprises:

a switch matrix comprising a plurality of switches, one end of each of the plurality of switches being coupled to the clock delay unit to receive a corresponding clock signal among the original clock signal and the plurality of delayed clock signals, the other end of each of the plurality of switches being coupled to the clock broadening unit to provide the clock signal selected by the signal selecting unit to the clock broadening unit; and a switch matrix control unit configured to control the plurality of switches to be cyclically turned on in sequence based on an enable signal, so that the original clock signal and the plurality of delayed clock signals are selected by the signal selecting unit in the predetermined order.

2. The apparatus according to claim 1, wherein the clock delay unit comprises a plurality of delay components connected in sequence, the number of the delay components is equal to the number of the delayed clock signals, the original clock signal is provided to a first delay component of the plurality of delay components, and each of the plurality of delay components respectively provides a respective delayed clock signal of the plurality of delayed clock signals.

3. The apparatus according to claim 2, wherein each of the plurality of delay components is configured to provide the same amount of delay.

4. The apparatus according to claim 1, wherein the switch matrix control unit comprises:

a starting unit configured to generate a broadening start signal based on the enable signal; and a switch signal generating unit configured to generate corresponding control signals for controlling the plurality of switches based on the broadening start signal, so that the plurality of switches are cyclically turned on in sequence.

5. The apparatus according to claim 4, wherein the starting unit comprises:

a pulse generator configured to generate a pulse signal based on the enable signal;

an OR gate, one input end of which receives the pulse signal, and the other input end of which receives the control signal of the last switch in the plurality of switches; and an SR latch, an S input end of which is connected to an output end of the OR gate, an R input end of which receives the control signal of the first switch in the plurality of switches, and an output end of which provides the broadening start signal.

6. The apparatus according to claim 4, wherein the switch signal generating unit comprises:

a multiplexer, one input end of which receives the broad-
ened clock signal, and the other input end of which
receives the original clock signal;
a plurality of D flip-flops connected in series, wherein a
D input end of the first D flip-flop in the plurality of D
flip-flops receives the broadening start signal, D input
ends of D flip-flops other than the first D flip-flop
among the plurality of D flip-flops are connected to Q
output ends of previous D flip-flops, clock input ends of
the plurality of D flip-flops are connected to output
ends of the multiplexer, and Q output ends of the
plurality of D flip-flops respectively provide the control
signals for the plurality of switches; and
a first additional D flip-flop, a clock input end of which is
connected to the Q output end of the first D flip-flop, a
D input end of which receives the enable signal, and a
Q output end of which is connected to a selection
control end of the multiplexer.
7. The apparatus according to claim 1, wherein the clock
broadening unit comprises:
a second additional D flip-flop, a clock input end of which
receives the clock signal selected by the signal select-
ing unit; and
an inverter, an input end of the inverter being connected
to a Q output end of the second additional D flip-flop,
an output end of the inverter being connected to a D
input end of the second additional D flip-flop, and an
output end of the inverter providing the broadened
clock signal.
8. A method for generating a circuit clock signal, com-
prising:
buffering an original clock signal to obtain a buffered
clock signal;
delaying the original clock signal to obtain a plurality of
delayed clock signals, the plurality of delayed clock
signals being respectively delayed by different amounts
of time relative to the original clock signal;
generating a broadened clock signal based on the original
clock signal and the plurality of delayed clock signals,
the frequency of the broadened clock signal being
lower than that of the original clock signal; and
selecting one of the buffered clock signal and the broad-
ened clock signal as the circuit clock signal based on a
selection signal,
wherein the generating the broadened clock signal based
on the original clock signal and the plurality of delayed
clock signals comprises:

16 cyclically selecting, by a signal selecting unit, a clock
signal from the original clock signal and the plurality
of delayed clock signals in a predetermined order;
and
generating, by a clock broadening unit, the broadened
clock signal based on the clock signal selected by the
signal selecting unit, and
wherein the cyclically selecting, by a signal selecting unit,
the clock signal from the original clock signal and the
plurality of delayed clock signals in a predetermined
order comprises:
controlling, by a switch matrix control unit, a plurality of
switches of a switch matrix to be cyclically turned on
in sequence based on an enable signal, so that the
original clock signal and the plurality of delayed clock
signals are selected by the signal selecting unit in the
predetermined order, wherein one end of each of the
plurality of switches is coupled to the clock delay unit
to receive a corresponding clock signal among the
original clock signal and the plurality of delayed clock
signals, the other end of each of the plurality of
switches is coupled to the clock broadening unit to
provide the clock signal selected by the signal selecting
unit to the clock broadening unit.
9. The method according to claim 8, wherein the delaying
the original clock signal comprises:
delaying the original clock signal by a plurality of delay
components connected in sequence, wherein the num-
ber of the delay components is equal to the number of
the delayed clock signals, the original clock signal is
provided to a first delay component of the plurality of
delay components, and each of the plurality of delay
components respectively provides a respective delayed
clock signal of the plurality of delayed clock signals.
10. The method according to claim 8, wherein the con-
trolling, by the switch matrix control unit, the plurality of
switches of the switch matrix to be cyclically turned on in
sequence based on the enable signal comprises:
generating, by a starting unit, a broadening start signal
based on the enable signal; and
generating, by a switch signal generating unit, corre-
sponding control signals for controlling the plurality of
switches based on the broadening start signal, so that
the plurality of switches are cyclically turned on in
sequence.

* * * * *